US011621183B2

United States Patent
Zhang et al.

(10) Patent No.: US 11,621,183 B2
(45) Date of Patent: Apr. 4, 2023

(54) TRANSFER DEVICE AND TRANSFER METHOD FOR MICRO LIGHT-EMITTING DIODE (MICRO LED), AND DISPLAY DEVICE

(71) Applicant: TCL China Star Optoelectronics Technology Co., Ltd., Shenzhen (CN)

(72) Inventors: Wei Zhang, Shenzhen (CN); Yang Sun, Shenzhen (CN); Minggang Liu, Shenzhen (CN); Shujhih Chen, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 315 days.

(21) Appl. No.: 16/767,135

(22) PCT Filed: Apr. 22, 2020

(86) PCT No.: PCT/CN2020/086104
§ 371 (c)(1),
(2) Date: May 27, 2020

(87) PCT Pub. No.: WO2021/196311
PCT Pub. Date: Oct. 7, 2021

(65) Prior Publication Data
US 2022/0122863 A1 Apr. 21, 2022

(30) Foreign Application Priority Data
Apr. 3, 2020 (CN) .......................... 202010257544.1

(51) Int. Cl.
*H01L 21/67* (2006.01)
*H01L 21/683* (2006.01)
(Continued)

(52) U.S. Cl.
CPC .... *H01L 21/67271* (2013.01); *H01L 21/6835* (2013.01); *H01L 22/20* (2013.01);
(Continued)

(58) Field of Classification Search
CPC ........... H01L 21/67271; H01L 21/6835; H01L 22/20; H01L 25/0753; H01L 33/0095;
(Continued)

(56) References Cited

U.S. PATENT DOCUMENTS 5,888,127 A    3/1999   Piper et al.
2018/0158706 A1   6/2018   Hsu et al.
(Continued)

FOREIGN PATENT DOCUMENTS

| CN | 201676674 | 12/2010 |
|---|---|---|
| CN | 107039298 | 8/2017 |

(Continued)

*Primary Examiner* — Patricia D Valenzuela

(57) ABSTRACT

A transfer device for a micro light-emitting diode (micro LED) of the present application includes a collecting tube and a driving device. The collecting tube has a first end and a second end disposed oppositely, and the collecting tube includes a collecting opening and a storage tube, and the collecting opening is connected to the storage tube, and the collecting opening is disposed at the first end. The driving device is disposed at the second end, and the driving device is configured to provide a driving force, wherein the driving device is configured to provide the driving force to pick up the micro LED from the collecting opening into the storage tube so that the storage tube is able to store and stack at least two micro LEDs.

20 Claims, 3 Drawing Sheets

(51) Int. Cl.
    *H01L 21/66*     (2006.01)
    *H01L 25/075*     (2006.01)
    *H01L 33/00*     (2010.01)
    *H01L 33/62*     (2010.01)
    *H01L 21/677*     (2006.01)

(52) U.S. Cl.
    CPC ...... *H01L 25/0753* (2013.01); *H01L 33/0095* (2013.01); *H01L 33/62* (2013.01); *H01L 21/67778* (2013.01); *H01L 21/6838* (2013.01); *H01L 2221/68354* (2013.01); *H01L 2221/68368* (2013.01); *H01L 2221/68386* (2013.01); *H01L 2933/0066* (2013.01)

(58) Field of Classification Search
    CPC ........... H01L 33/62; H01L 2221/68354; H01L 2221/68368; H01L 2221/68386; H01L 2933/0066; H01L 21/67144; H01L 21/67769; H01L 21/6838; H01L 21/67778; H01L 33/48; H01L 2221/68313; H01L 2933/0033; G09F 9/33
    See application file for complete search history.

(56) References Cited

U.S. PATENT DOCUMENTS

| | | |
|---|---|---|
| 2019/0348313 A1 | 11/2019 | Hsu et al. |
| 2019/0371647 A1 | 12/2019 | Ahn et al. |

FOREIGN PATENT DOCUMENTS

| | | |
|---|---|---|
| CN | 110838503 | 2/2020 |
| CN | 210050592 | 2/2020 |
| CN | 111162034 | 5/2020 |
| CN | 110544661 | 9/2020 |
| JP | 2017-122608 | 7/2017 |

TRANSFER DEVICE AND TRANSFER METHOD FOR MICRO LIGHT-EMITTING DIODE (MICRO LED), AND DISPLAY DEVICE

RELATED APPLICATIONS

This application is a National Phase of PCT Patent Application No. PCT/CN2020/086104 having International filing date of Apr. 22, 2020, which claims the benefit of priority of Chinese Patent Application No. 202010257544.1 filed on Apr. 3, 2020. The contents of the above applications are all incorporated by reference as if fully set forth herein in their entirety.

FIELD AND BACKGROUND OF THE INVENTION

The present application relates to a field of display technology, and more particularly to a transfer device and a transfer method for a micro light-emitting diode (micro LED), and a display device.

Micro light-emitting diodes (micro LEDs) are a new type of self-luminous display technology, which has the advantages of high brightness, good luminous efficiency, low power consumption, long lifespan, thin and light-weight, etc. so that it is expected to become the next generation of mainstream display technology. Compared with the current main displays, such as LCD displays and OLED displays, its power consumption is significantly reduced, which is 10% of LCDs, 50% of OLEDs, and a brightness magnitude thereof is higher than OLED by several orders.

Micro LED technology mainly arranges LEDs of a few micrometers to tens of micrometers over a substrate in an array, and a LED array has a high density and a small size. However, current developments of micro LEDs are subject to key technologies such as chip transfer (with mass transfer). However, at present, the mass transfer of chips and bonding of chips and a substrate after the mass transfer are bottlenecks of improving yields of the micro LED display technology.

Nowadays, technical methods for transferring micro LEDs mainly comprises van der Waals force, electrostatic adsorption, fluid self-assembly, laser radiation and other ways for transferring. After alignment is completed, heating is performed for welding. However, slow speeds are found in these transfer methods, which serious impacts mass production of micro LED.

SUMMARY OF THE INVENTION

Embodiments of the present application provide a transfer device and a transfer device for a micro light-emitting diode (micro LED), and a display device, which can increase a transfer speed of micro LEDs and make the micro LED technology more suitable for mass production.

The present application provides a transfer device for a micro light-emitting diode (micro LED), which comprises:

a collecting tube, having a first end and a second end disposed oppositely, wherein the collecting tube comprises a collecting opening and a storage tube, and the collecting opening is connected to the storage tube, and the collecting opening is disposed at the first end;

a driving device disposed at the second end, and the driving device is configured to provide a driving force;

wherein the driving device is configured to provide the driving force to pick up the micro LED from the collecting opening into the storage tube so that the storage tube is able to store and stack at least two micro LEDs.

In some embodiments, the collecting tube comprises at least two or more the collecting tubes connected to the driving device, and the collecting tubes are detachably connected to the driving device, and the storage tube comprises at least two sub-connecting tubes, and the sub-connecting tubes are detachably connected.

In some embodiments, the transfer device further comprises a laser peeling device for peeling the micro LED from a temporary substrate.

In some embodiments, the collecting tube is formed with any one of a cylindrical chamber, a rectangular chamber, a triangular chamber, a diamond chamber, and a polygonal chamber.

In some embodiments, a material of the collecting tube is any one of polyimide plastic, polyethylene plastic, polyethylene terephthalate plastic, glass, quartz, and metal.

In some embodiments, the collecting tube and the driving device are connected by screwing or latching.

In some embodiments, the driving device comprises a processor and a power mechanism, and the processor receives a processing signal to control the power mechanism to generate power.

The present application further provides a transfer method for a micro light-emitting diode (micro LED), which comprises:

picking up the micro LED from a temporary substrate by a transfer device for a micro LED, wherein the transfer device for the micro LED comprises a collecting tube and a driving device, and the collecting tube has a first end and a second end disposed oppositely, and the collecting tube comprises a collecting opening and a storage tube, and the collecting opening is connected to the storage tube, and the collecting opening is disposed at the first end, and the driving device is disposed at the second end, and the driving device is configured to provide a driving force, and the driving device is configured to provide the driving force to peak up a micro LED from the collecting opening into the storage tube so that the storage tube is able to store and stack at least two micro LEDs;

storing the micro LED in the collecting tube of the transfer device for the micro LED; and transferring the micro LED in the collecting tube onto a target substrate.

In some embodiments, picking up the micro LED from the temporary substrate by the transfer device for the micro LED comprises:

providing driving force by the driving device to pick up the micro LED from the temporary substrate, wherein the driving force is any one of vacuum force, electromagnetic force, electrostatic force, and capillary force generated when the driving device is full with liquid.

In some embodiments, picking up the micro LED from the temporary substrate by the transfer device for the micro LED comprises:

peeling the micro LED from the temporary substrate; and picking up the micro LED peeled from the temporary substrate by the transfer device for the micro LED.

In some embodiments, before picking up the micro LED from the temporary substrate by the transfer device for the micro LED, further comprises detecting whether the micro LED is qualified; and if the micro LED is non-qualified, the non-qualified micro LED is transferred to a storage area by the transfer device for the micro LED.

In some embodiments, the collecting tube comprises at least two or more the collecting tubes connected to the driving device, and the collecting tubes are detachably connected to the driving device, and the storage tube comprises at least two sub-connecting tubes, and the sub-connecting tubes are detachably connected.

In some embodiments, the method further comprises a laser peeling device for peeling the micro LED from a temporary substrate.

In some embodiments, the collecting tube is formed with any one of a cylindrical chamber, a rectangular chamber, a triangular chamber, a diamond chamber, and a polygonal chamber.

A transfer device for a micro light-emitting diode (micro LED) of the present application comprises a collecting tube and a driving device. The collecting tube has a first end and a second end disposed oppositely, and the collecting tube comprises a collecting opening and a storage tube, and the collecting opening is connected to the storage tube, and the collecting opening is disposed at the first end. The driving device is disposed at the second end, and the driving device is configured to provide a driving force, wherein the driving device is configured to provide the driving force to pick up the micro LED from the collecting opening into the storage tube so that the storage tube is able to store and stack at least two micro LEDs. Traditional transfer devices for a micro LED use an array-type transfer head to pick up the micro LEDs. This type of array-type transfer head can only perform picking up corresponding one particular type of temporary substrate. Once a spacing between micro LEDs on the temporary substrate changes, transfer heads must be replaced. The transfer device for a micro LED of the present application can sequentially pick up and store micro LEDs from the collecting opening and store thereof in the storage tube. In this way, micro LEDs in different areas can be picked up so that it is able to adapt to pick up micro LEDs from substrates of multiple specifications and improve the flexibility of collecting micro LEDs. Moreover, in the present application, micro LEDs can be picked up individually or directly released to a target substrate. The convenience of a transfer process of the micro LEDs is further improved, making micro LED technology more suitable for mass production.

BRIEF DESCRIPTION OF THE SEVERAL VIEWS OF THE DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION OF SPECIFIC EMBODIMENTS OF THE INVENTION

Figure 1:
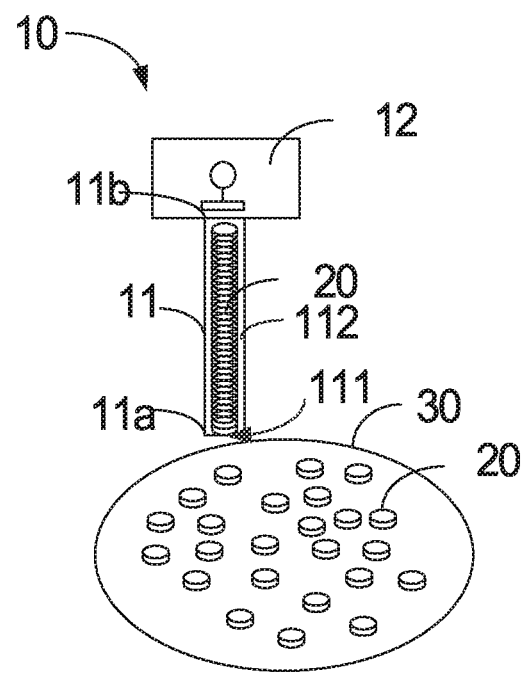
FIG. 1 is a schematic structural diagram of a transfer device for a micro light-emitting diode (micro LED) provided by an embodiment of the present application.

The technical solutions in the embodiments of the present application will be described clearly and completely with reference to the drawings in the embodiments of the present application. Obviously, the described embodiments are only a part of the embodiments of the present application, but not all the embodiments. Based on the embodiments in the present application, all other embodiments obtained by those skilled in the art without making creative work fall within the protection scope of the present application.

The following description is based on the specific embodiments of the present invention as illustrated and should not be construed as limiting the specific embodiments that are not described herein. The directional terms mentioned in the present invention, such as "upper", "lower", "before", "after", "left", "right", "inside", "outside", "side", etc., are only used to show direction in the figures. The directional terms used in the drawings are used to explain and explain the invention and are not intended to limit the scope of the invention. In addition, the terms "first" and "second" are used for descriptive purposes only, and cannot be understood as indicating or implying relative importance or implicitly indicating the number of technical features indicated. Thus, the features defined as "first" and "second" may explicitly or implicitly include one or more of the features. In the description of this application, the meaning of "a plurality of" is two or more, unless otherwise specifically limited.

Embodiments of the present application provide a transfer device and a transfer method for a micro light-emitting diode (micro LED), and a display device. Following transfer devices for a micro-LED are introduced in detail.

Figure 2:
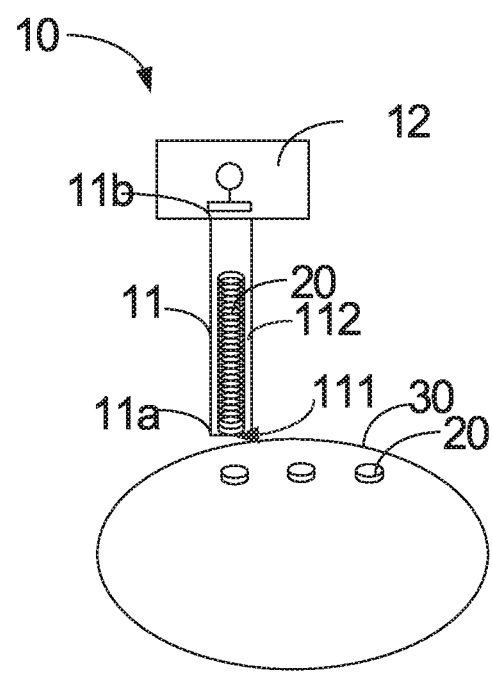
FIG. 2 is a schematic structural diagram of a transfer device for a micro LED provided by an embodiment of the present application after transferring micro LEDs.

Please refer to FIG. 1 and FIG. 2. FIG. 1 is a schematic structural diagram of a transfer device for a micro light-emitting diode (micro LED) provided by an embodiment of the present application. FIG. 2 is a schematic structural diagram of a transfer device for a micro LED provided by an embodiment of the present application after transferring micro LEDs.

Herein, a transfer device 10 for a micro light-emitting diode (micro LED) comprises a collecting tube 11 and a driving device 12. The collecting tube has a first end 11a and a second end 11b disposed oppositely. The collecting tube 11 comprises a collecting opening 111 and a storage tube 112, and the collecting opening 111 is connected to the storage tube 112, and the collecting opening 112 is disposed at the first end 11a. The driving device 12 is disposed at the second end 11b, and the driving device 12 is configured to provide a driving force. The driving device 12 is configured to provide the driving force to pick up a micro LED 20 from the collecting opening 111 into the storage tube 112 so that the storage tube 112 is able to store and stack at least two micro LEDs 20.

It is noted that, the first end 11a may be a lower end of the collecting tube 11, and the second end 11b may be an upper surface of the collecting tube 11. Of course, the first end 11a may also be an upper end of the collecting tube 11, and the second end 11b may be a lower surface of the collecting tube 11. It can be understood that the first end 11a and the second end 11b only illustrate the relative positional relationship of the collecting tube 11, and positions thereof can be interchanged according to specific usage conditions.

Figure 3:
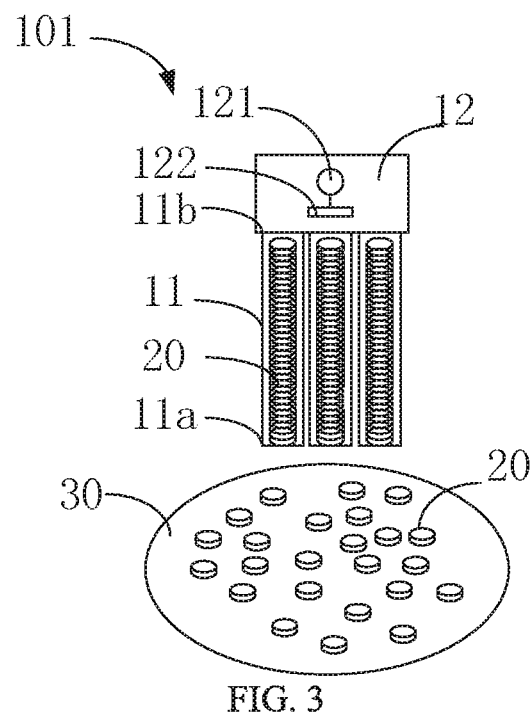
FIG. 3 is a schematic structural diagram of another transfer device for a micro LED provided by an embodiment of the present application.

Please refer to FIG. 3, FIG. 3 is a schematic structural diagram of another transfer device 10 for a micro LED provided by an embodiment of the present application. The collecting tube 11 comprises at least two or more the collecting tubes 11 connected to the driving device 12. It is noted that, the micro LEDs 20 can be picked up simultaneously by the plurality of collecting tubes 11. This can greatly improve the speed of picking up the micro LEDs 20.

Specifically, the collecting tubes 11 are detachably connected to the driving device 12. The storage tube 11 comprises at least two sub-connecting tubes, and the sub-connecting tubes are detachably connected. More specifically, the collecting tube 11 and the driving device 12 are connected by screwing or latching to realize detachably connected connections therebetween. The sub-connecting tubes and the sub-connection tubes can also be detachably connected by screwing or latching to realize detachably connected connections therebetween. Of course, other detachable connecting methods can also be used, which are not described in detail in the embodiments of the present application.

It should be noted that, the collecting tube 11 and the driving device 12 are detachably connected, which can make the transportation or transfer of the transfer device for the micro LED more convenient. At the same time, the sub-connection tubes and the sub-connection tubes are detachably connected so that storage can be expanded as needed to improve the scope of application of the transfer device for the micro LED.

Specifically, each collecting tube 11 is connected to the same driving device 12 so that all collecting tubes 11 can be uniformly picked up by the driving device 12, which not only can improve the efficiency of picking up the micro LEDs 20, but also can reduce cost.

In addition, each collecting tube 11 can be independently connected to one driving device 12 so that the micro LEDs 20 in a specific area can be picked up as needed. For example, the micro LED 20 may also comprise a detecting device that can detect whether the micro LED 20 is qualified. If the micro LED 20 is detected to be non-qualified, the corresponding driving device 12 can be controlled to pick up the non-qualified micro LED 20 and put it into a waste storage area. Alternatively, the non-qualified micro LED 20 is stored in the collecting tube 11.

The driving device 12 may comprise a processor 121 and a power mechanism 122. The processor 121 may receive a processing signal and control the power mechanism 122 to generate power. It can be understood that the power mechanism 122 may be a vacuum pump, and the vacuum pump may generate a vacuum attracting force so that the collecting tube 11 can pick up the micro LED 20 through the vacuum attraction force. Of course, the power mechanism 122 may also be an electromagnetic device, and the electromagnetic device may generate an electromagnetic force. The electromagnetic force may enable the collecting tube 11 to pick up the micro LED. Of course, the power mechanism 122 is not limited to the above, and details are not repeated in the embodiments of the present application.

Figure 4:
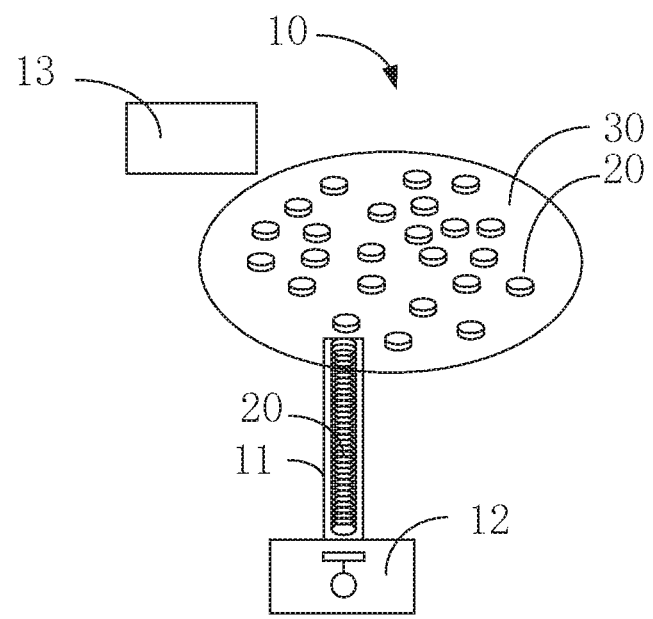
FIG. 4 is a schematic structural diagram of yet another transfer device for a micro LED provided by an embodiment of the present application.

Please refer to FIG. 4, FIG. 4 is a schematic structural diagram of yet another transfer device 10 for a micro LED provided by an embodiment of the present application. The transfer device 10 further comprises a laser peeling device 13, and the laser peeling device 13 is used for peeling the micro LED 20.

The micro LED 20 is peeled from the temporary substrate 30 by the laser peeling device 13, and the transfer device 10 for the micro LED can pick up the micro LED 20 peeled by the laser peeling device 13. At the same time, the transfer device 10 for the micro LED can pick up the micro LED 20 by gravity when picking up the peeled micro LED 20. In addition, during the process of the collecting tube 11 picking up the micro LED 20, the driving device 12 can be controlled to generate a driving force, thereby controlling a falling speed of the micro LED 20 in the collecting tube 11.

Herein, the collecting tube 11 is formed with any one of a cylindrical chamber, a rectangular chamber, a triangular chamber, a diamond chamber, and a polygonal chamber.

It is noted that the shape of the collecting tube 11 is not limited to this, and the collecting tube 11 can also be adjusted adaptively according to the shape of the micro LED 20.

For example, once the shape of the micro LED 20 is circular, then the shape of the collecting tube 11 is cylindrical. A diameter of the collecting tube 11 is greater than a diameter of the micro LED 20. When the micro LEDs 20 are stored in the collecting tube 11, the micro LEDs 20 can be stacked in sequence, and therefore the collecting tube 11 can pick up a plurality of micro LEDs 20. At the same time, since the picked micro LEDs 20 are stacked by layers so that the micro LEDs 20 can be well arranged when transferred to a target substrate. This further increases the transfer speed of the micro LEDs 20.

Herein, a material of the collecting tube 11 is any one of polyimide plastic, polyethylene plastic, polyethylene terephthalate plastic, glass, quartz, and metal.

It can be understood that the material of the collecting tube 11 is not limited to this, and the material specifically adopted by the collecting tube 11 may also be other materials, such as ceramics.

A transfer device 10 for a micro light-emitting diode (micro LED) provided by an embodiment of the present application comprises a collecting tube 11 and a driving device 12. The collecting tube 11 has a first end 11a and a second end 11b disposed oppositely, and the collecting tube 11 comprises a collecting opening 111 and a storage tube 112, and the collecting opening 111 is connected to the storage tube 112, and the collecting opening 111 is disposed at the first end 11a. The driving device 12 is disposed at the second end 11b, and the driving device 12 is configured to provide a driving force, wherein the driving device 12 is configured to provide the driving force to pick up the micro LED 20 from the collecting opening 111 into the storage tube 112 so that the storage tube 111 is able to store and stack at least two micro LEDs 20. Traditional transfer devices for a micro LED use an array-type transfer head to pick up the micro LEDs. This type of array-type transfer head can only perform picking up corresponding one particular type of temporary substrate. Once a spacing between micro LEDs on the temporary substrate changes, transfer heads must be replaced. The transfer device 10 for a micro LED of the present application can sequentially pick up and store micro LEDs 20 from the collecting opening 111 and store thereof in the storage tube 112. In this way, micro LEDs 20 in different areas can be picked up so that it is able to adapt to pick up micro LEDs 20 from substrates of multiple specifications and improve the flexibility of collecting micro LEDs 20. Moreover, in the present application, micro LEDs 20 can be picked up individually or directly released to a target substrate. Convenience of a transfer process of the micro LEDs 20 is further improved, making micro LED technology more suitable for mass production.

Figure 5:
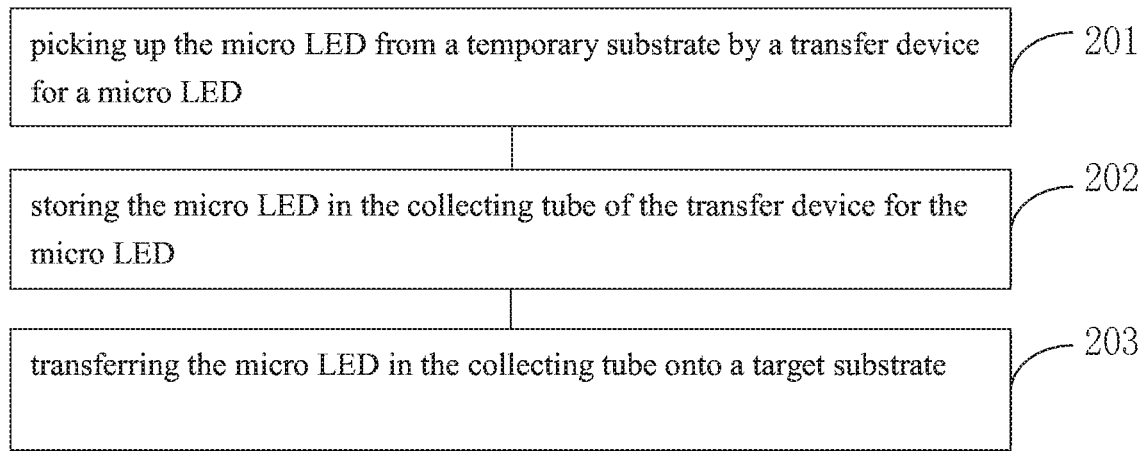
FIG. 5 is a schematic flowchart of a transfer method for a micro LED provided by an embodiment of the present application.

Please refer to FIG. 5, FIG. 5 is a schematic flowchart of a transfer method for a micro LED provided by an embodiment of the present application. Herein, the present application further provides a transfer method for a micro light-emitting diode (micro LED), which comprises following steps:

Step 201: picking up the micro LED from a temporary substrate by a transfer device for a micro LED.

It should be noted that the transfer device for the micro LED is the transfer device for the micro LED described in the above embodiments. Since the transfer device for the micro LED have been described in detail in the above embodiments, the transfer device for the micro LED will not be described in detail in the embodiments of the present application.

In addition, the transfer device for the micro LED may comprise a plurality of collecting tubes to simultaneously pick up the micro LEDs on the temporary substrate. This can speed up the speed of picking up the micro LEDs.

Step 202: storing the micro LED in the collecting tube of the transfer device for the micro LED.

It is noted that the collecting tube is formed with any one of a cylindrical chamber, a rectangular chamber, a triangular chamber, a diamond chamber, and a polygonal chamber. A shape of the collecting tube can be adjusted adaptively according to the specific shape of the micro LED.

Herein, the collecting tube comprises a collecting opening and a storage tube, and the collecting opening and the storage tube are connected. The collecting opening is provided at the first end, that is to say, the micro LED enters the storage tube from the collecting opening and use the storage tube to store the micro LED. The micro LEDs are stacked and stored in the storage tube.

For example, the shape of the micro LED is circular, then the shape of the collecting tube is cylindrical. The diameter of the collecting tube is larger than the diameter of the micro LED. When the micro LEDs are stored in the collecting tube, the micro LEDs can be stacked in sequence, so the collecting tube can pick up multiple micro LEDs. At the same time, since the picked micro LEDs are stacked, the micro LEDs can be well arranged when transferred to the target substrate, and this further improves the transfer speed of the micro LEDs.

Step 203: transferring the micro LED in the collecting tube onto a target substrate.

It is noted that the micro LEDs in the collecting tube are aligned with the target substrate, and the micro luminescence is accurately transferred to the target substrate, thereby completing the transfer of the micro LEDs.

In some embodiments, the step "picking up the micro LED from the temporary substrate by the transfer device for the micro LED" comprises following steps:

providing driving force by the driving device to pick up the micro LED from the temporary substrate, wherein the driving force is any one of vacuum force, electromagnetic force, electrostatic force, and capillary force generated when the driving device is full with liquid.

It is noted that the driving device may comprise a processor and a power mechanism. The processor may receive a processing signal and control the power mechanism to generate power. It can be understood that the power mechanism may be a vacuum pump, and the vacuum pump may generate a vacuum attracting force so that the collecting tube can pick up the micro LED through the vacuum attraction force. Of course, the power mechanism may also be an electromagnetic device, and the electromagnetic device may generate an electromagnetic force. The electromagnetic force may enable the collecting tube to pick up the micro LED. Of course, the power mechanism is not limited to the above, and details are not repeated in the embodiments of the present application.

In some embodiments, the step "picking up the micro LED from the temporary substrate by the transfer device for the micro LED" comprises following steps:

(1): peeling the micro LED from the temporary substrate.

It should be noted that the method of peeling the micro LED from the temporary substrate may be transfer peeling through the micro light emitting diode. Specifically, the driving device in the transfer device for the micro LED generates a suction force so that the micro LED is peeled off from the temporary substrate. The micro LED is removed from the temporary substrate by the transfer device for the micro LED. In this way, there is no need to add an additional stripping process, which can accelerate the transfer speed of the micro LED.

Specifically, the micro LED is peeled from the temporary substrate by a laser peeling device.

It is noted that the micro LED is peeled off from the temporary substrate by the laser peeling device, and the transfer device for the micro LED can pick up the micro LED peeled off by the laser peeling device. At the same time, the transfer device for the micro LED picks up the micro LED, which can pick up the micro LEDs by gravity. In addition, during the process of picking up the micro LEDs in the collecting tube, the driving force generated by the driving device can be controlled, thereby controlling the falling speed of the micro LEDs in the collecting tube.

(2): picking up the micro LED peeled from the temporary substrate by the transfer device for the micro LED.

It is noted that the collecting tube not only peels the micro LEDs from the temporary substrate but also picks up and stores the micro LEDs in the collecting tube so that the collecting tube can play multiple roles and reduce processes of transferring micro LEDs. This speeds up the transfer of micro LEDs.

In some embodiments, before the step "picking up the micro LED from the temporary substrate by the transfer device for the micro LED", the method further comprises following steps:

(1): detecting whether the micro LED is qualified.

It is noted that the micro LED is detected by a detecting device to detects whether it is qualified. Specific detection methods can detect whether the electrical characteristics, optical characteristics, etc. of the micro LED comply with the regulations. If the electrical characteristics or optical characteristics of the micro LED is qualified, it is confirmed that the micro LED is a qualified micro LED. If the electrical or optical characteristics of the micro LED are not qualified, the micro LED is confirmed as a non-qualified micro LED.

(2): if the micro LED is non-qualified, the non-qualified micro LED is transferred to a storage area by the transfer device for the micro LED.

It is noted that the storage area may be a storage device for storing non-qualified micro LEDs, or may be stored in the collecting tube. If the non-qualified micro LEDs are stored in the collecting tube, the non-qualified micro LEDs need to be marked. Therefore, it is ensured that the non-qualified micro LEDs will not be transferred to the target substrate. It is noted that the mark described in the embodiment of the present application may be a processing method adapted in the processor.

Through the detection of the micro LED in the embodiments of the present application, it can be ensured that qualified micro LED is transferred to the target substrate, thereby ensuring that the micro LED transferred to the target substrate are available, which can improve effects of the display device.

As a result of adopting the transfer method for a micro LED of the present application, micro LEDs in different areas can be picked up to effectively increase the transfer speed, and the micro LEDs can be picked up individually or directly released to the target substrate. The convenience of the micro LEDs in the transfer process is further improved, making the micro LED technology more suitable for mass production.

Figure 6:
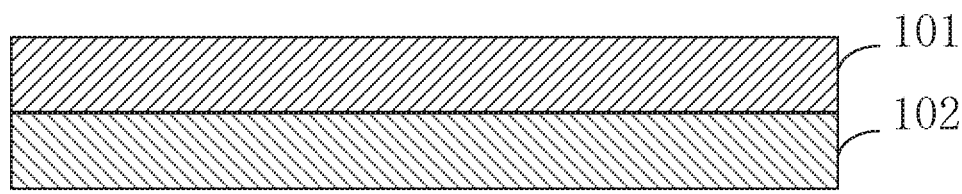
FIG. 6 is a schematic structural diagram of a display device provided by an embodiment of the present application.

Please refer to FIG. 6, FIG. 6 is a schematic structural diagram of a display device 100 provided by an embodiment of the present application. The display device 100 comprises a substrate 102 and a micro LED layer 101. The micro LED layer 101 is transferred using the above transfer method for the micro LED 20. In this embodiment, it will not be described in detail.

Since the embodiment of the present application adopts the transfer method for the micro LED 20 in the above embodiment, the display device 100 of the present application is very fast in manufacturing and suitable for mass production.

A transfer device and a transfer method for a micro light-emitting diode (micro LED), and a display device provided by the embodiments of the present application have been described in detail above, and specific examples have been used to explain the principles and implementations of the present application. The descriptions of the above embodiments are only used to help understand the technology of the present application, solutions and their core ideas; those of ordinary skill in the art should understand that they can still modify the technical solutions described in the foregoing embodiments or equivalently replace some of the technical features, and these modifications or replacements do not make the essence of the corresponding technical solutions deviate from the scope of the technical solutions of the embodiments of the present application.

What is claimed is:

1. A transfer device for a micro light-emitting diode (micro LED), comprising:
    a collecting tube, having a first end and a second end disposed oppositely, wherein the collecting tube comprises a collecting opening and a storage tube, and the collecting opening is connected to the storage tube, and the collecting opening is disposed at the first end;
    a driving device disposed at the second end, and the driving device is configured to provide a driving force;
    wherein the driving device is configured to provide the driving force to pick up the micro LED from the collecting opening into the storage tube so that the storage tube is able to store and stack at least two micro LEDs.

2. The transfer device according to claim 1, wherein the collecting tube comprises at least two or more the collecting tubes connected to the driving device, and the collecting tubes are detachably connected to the driving device, and the storage tube comprises at least two sub-connecting tubes, and the sub-connecting tubes are detachably connected.

3. The transfer device according to claim 1, further comprising a laser peeling device for peeling the micro LED from a temporary substrate.

4. The transfer device according to claim 1, wherein the collecting tube is formed with any one of a cylindrical chamber, a rectangular chamber, a triangular chamber, a diamond chamber, and a polygonal chamber.

5. The transfer device according to claim 1, wherein a material of the collecting tube is any one of polyimide plastic, polyethylene plastic, polyethylene terephthalate plastic, glass, quartz, and metal.

6. The transfer device according to claim 2, wherein the collecting tube and the driving device are connected by screwing or latching.

7. The transfer device according to claim 1, wherein the driving device comprises a processor and a power mechanism, and the processor receives a processing signal to control the power mechanism to generate power.

8. A transfer method for a micro light-emitting diode (micro LED), comprising:
    picking up the micro LED from a temporary substrate by a transfer device for a micro LED, wherein the transfer device for the micro LED comprises a collecting tube and a driving device, and the collecting tube has a first end and a second end disposed oppositely, and the collecting tube comprises a collecting opening and a storage tube, and the collecting opening is connected to the storage tube, and the collecting opening is disposed at the first end, and the driving device is disposed at the second end, and the driving device is configured to provide a driving force, and the driving device is configured to provide the driving force to pick up a micro LED from the collecting opening into the storage tube so that the storage tube is able to store and stack at least two micro LEDs;
    storing the micro LED in the collecting tube of the transfer device for the micro LED; and
    transferring the micro LED in the collecting tube onto a target substrate.

9. The transfer method according to claim 8, wherein picking up the micro LED from the temporary substrate by the transfer device for the micro LED comprises:
    providing driving force by the driving device to pick up the micro LED from the temporary substrate, wherein the driving force is any one of vacuum force, electromagnetic force, electrostatic force, and capillary force generated when the driving device is full with liquid.

10. The transfer method according to claim 8, wherein picking up the micro LED from the temporary substrate by the transfer device for the micro LED comprises:
    peeling the micro LED from the temporary substrate; and
    picking up the micro LED peeled from the temporary substrate by the transfer device for the micro LED.

11. The transfer method according to claim 8, wherein before picking up the micro LED from the temporary substrate by the transfer device for the micro LED, further comprising:
    detecting whether the micro LED is qualified; and
    if the micro LED is non-qualified, the non-qualified micro LED is transferred to a storage area by the transfer device for the micro LED.

12. The transfer method according to claim 8, wherein the collecting tube comprises at least two or more the collecting tubes connected to the driving device, and the collecting tubes are detachably connected to the driving device, and the storage tube comprises at least two sub-connecting tubes, and the sub-connecting tubes are detachably connected.

13. The transfer method according to claim 8, further comprising a laser peeling device for peeling the micro LED from a temporary substrate.

14. The transfer method according to claim 8, wherein the collecting tube is formed with any one of a cylindrical chamber, a rectangular chamber, a triangular chamber, a diamond chamber, and a polygonal chamber.

15. A display device, comprising a transfer device for a micro light-emitting diode (micro LED), wherein the transfer device for the micro LED comprises a collecting tube and a driving device, and the collecting tube has a first end and a second end disposed oppositely, and the collecting tube comprises a collecting opening and a storage tube, and the collecting opening is connected to the storage tube, and the collecting opening is disposed at the first end, and the driving device is disposed at the second end, and the driving device is configured to provide a driving force, and the driving device is configured to provide the driving force to pick up a micro LED from the collecting opening into the storage tube so that the storage tube is able to store and stack at least two micro LEDs.

16. The display device according to claim 15, wherein the collecting tube comprises at least two or more the collecting tubes connected to the driving device, and the collecting tubes are detachably connected to the driving device, and the storage tube comprises at least two sub-connecting tubes, and the sub-connecting tubes are detachably connected.

17. The display device according to claim 15, further comprising a laser peeling device for peeling the micro LED from a temporary substrate.

18. The display device according to claim 15, wherein the collecting tube is formed with any one of a cylindrical chamber, a rectangular chamber, a triangular chamber, a diamond chamber, and a polygonal chamber.

19. The display device according to claim 15, wherein a material of the collecting tube is any one of polyimide plastic, polyethylene plastic, polyethylene terephthalate plastic, glass, quartz, and metal.

20. The display device according to claim 16, wherein the collecting tube and the driving device are connected by screwing or latching.

\* \* \* \* \*